United States Patent
Toriumi et al.

(10) Patent No.: US 9,044,793 B2
(45) Date of Patent: Jun. 2, 2015

(54) METHOD FOR CLEANING FILM FORMATION APPARATUS AND METHOD FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventors: Satoshi Toriumi, Kanagawa (JP); Makoto Furuno, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 113 days.

(21) Appl. No.: 13/680,187

(22) Filed: Nov. 19, 2012

(65) Prior Publication Data

US 2013/0130476 A1    May 23, 2013

(30) Foreign Application Priority Data

Nov. 22, 2011   (JP) .................................. 2011-254546

(51) Int. Cl.
  *H01L 21/00*   (2006.01)
  *B08B 7/04*   (2006.01)
  *H01L 21/20*   (2006.01)
  *B08B 7/00*   (2006.01)
  (Continued)

(52) U.S. Cl.
CPC . *B08B 7/04* (2013.01); *H01L 21/20* (2013.01); *B08B 7/0071* (2013.01); *B82Y 40/00* (2013.01); *B08B 7/00* (2013.01); *C23C 16/4405* (2013.01); *C23C 16/0281* (2013.01); *C23C 16/26* (2013.01); *H01L 29/1606* (2013.01); *H01M 10/052* (2013.01); *H01M 4/131* (2013.01); *H01M 4/625* (2013.01); *H01L 29/66431* (2013.01); *H01L 29/7781* (2013.01); *Y02E 60/122* (2013.01)

(58) Field of Classification Search
None
See application file for complete search history.

(56) References Cited

U.S. PATENT DOCUMENTS

| 4,657,616 A | 4/1987 | Benzing et al. |
| 5,158,644 A | 10/1992 | Cheunt et al. |

(Continued)

FOREIGN PATENT DOCUMENTS

| EP | 0 728 850 A2 | 8/1996 |
| JP | 2002-115064 | 4/2002 |

(Continued)

OTHER PUBLICATIONS

Zhou.X et al., "Graphene modified LiFePO4 cathode materials for high power lithium ion batteries ,", J. Mater. Chem. (Journal of Materials Chemistry), 2011, vol. 21, pp. 3353-3358.

(Continued)

*Primary Examiner* — Scott B Geyer
*Assistant Examiner* — Evren Seven
(74) *Attorney, Agent, or Firm* — Nixon Peabody LLP; Jeffrey L. Costellia

(57) ABSTRACT

A method for cleaning a hot-wall type film formation apparatus having a batch processing system with industrially high mass productivity is provided. In the method, a carbon film deposited on an inner wall or the like of a reaction chamber of the apparatus is removed efficiently in a short time. To remove the carbon film deposited on the inner wall of the reaction chamber by a thermal CVD method, the reaction chamber is heated at a temperature higher than or equal to 700° C. and lower than or equal to 800° C., and oxygen is introduced into the reaction chamber.

18 Claims, 10 Drawing Sheets

(51) Int. Cl.

| | | |
|---|---|---|
| *C23C 16/44* | (2006.01) | |
| *C23C 16/02* | (2006.01) | |
| *C23C 16/26* | (2006.01) | |
| *H01L 29/16* | (2006.01) | |
| *H01M 10/052* | (2010.01) | |
| *H01M 4/131* | (2010.01) | |
| *H01M 4/62* | (2006.01) | |
| *H01L 29/66* | (2006.01) | |
| *H01L 29/778* | (2006.01) | |
| *B82Y 40/00* | (2011.01) | |

(56) References Cited

U.S. PATENT DOCUMENTS

| | | | |
|---|---|---|---|
| 5,203,956 A | 4/1993 | Hansen | |
| 5,421,957 A | 6/1995 | Carlson et al. | |
| 6,042,654 A | 3/2000 | Comita et al. | |
| 6,475,664 B1 | 11/2002 | Kawakami et al. | |
| 6,846,739 B1* | 1/2005 | Cathey et al. | 438/627 |
| 6,926,014 B2* | 8/2005 | Cheng et al. | 134/22.18 |
| 7,179,561 B2 | 2/2007 | Niu et al. | |
| 7,745,047 B2 | 6/2010 | Zhamu et al. | |
| 7,842,432 B2 | 11/2010 | Niu et al. | |
| 7,939,218 B2 | 5/2011 | Niu | |
| 7,977,007 B2 | 7/2011 | Niu et al. | |
| 7,977,013 B2 | 7/2011 | Niu et al. | |
| 8,278,011 B2 | 10/2012 | Zhu et al. | |
| 8,591,659 B1* | 11/2013 | Fang et al. | 134/1.1 |
| 2001/0014544 A1* | 8/2001 | Tanaka et al. | 438/905 |
| 2006/0121194 A1 | 6/2006 | Aiso | |
| 2007/0224830 A1* | 9/2007 | Samoilov | 438/714 |
| 2007/0264807 A1 | 11/2007 | Leone et al. | |
| 2008/0142046 A1 | 6/2008 | Johnson et al. | |
| 2008/0254296 A1 | 10/2008 | Handa et al. | |
| 2008/0286697 A1* | 11/2008 | Verhaverbeke et al. | 430/322 |
| 2010/0101602 A1* | 4/2010 | Deehan et al. | 134/1.1 |
| 2010/0143798 A1 | 6/2010 | Zhamu et al. | |
| 2010/0176337 A1 | 7/2010 | Zhamu et al. | |
| 2010/0180913 A1 | 7/2010 | Arena et al. | |
| 2010/0248034 A1 | 9/2010 | Oki et al. | |
| 2010/0273291 A1* | 10/2010 | Krylouk et al. | 438/99 |
| 2010/0330421 A1 | 12/2010 | Cui et al. | |
| 2011/0012067 A1 | 1/2011 | Kay | |
| 2011/0111303 A1 | 5/2011 | Kung et al. | |
| 2011/0121240 A1 | 5/2011 | Amine et al. | |
| 2011/0151278 A1* | 6/2011 | Gurney et al. | 428/800 |
| 2011/0159372 A1 | 6/2011 | Zhamu et al. | |
| 2011/0229795 A1 | 9/2011 | Niu et al. | |
| 2013/0130476 A1* | 5/2013 | Toriumi et al. | 438/478 |

FOREIGN PATENT DOCUMENTS

| | | |
|---|---|---|
| JP | 2006-265751 | 10/2006 |
| JP | 2009-524567 | 7/2009 |
| JP | 2009-176721 | 8/2009 |
| JP | 2011-503804 | 1/2011 |
| JP | 2011-517053 | 5/2011 |
| WO | WO-2006/062947 A2 | 6/2006 |
| WO | WO-2007/061945 A2 | 5/2007 |
| WO | WO-2009/061685 A1 | 5/2009 |
| WO | WO-2009/127901 A1 | 10/2009 |
| WO | WO-2009/144600 A2 | 12/2009 |

OTHER PUBLICATIONS

Su.F et al., "Flexible and planar graphene conductive additives for lithium-ion batteries,", J. Mater. Chem. (Journal of Materials Chemistry), 2010, vol. 20, pp. 9644-9650.

Yu.G et al., "Solution-Processed Graphene/MnO2 Nanostructured Textiles for High-Performance Electrochemical Capacitors,", Nano Letters, 2011, vol. 11, No. 7, pp. 2905-2911.

* cited by examiner

METHOD FOR CLEANING FILM FORMATION APPARATUS AND METHOD FOR MANUFACTURING SEMICONDUCTOR DEVICE

BACKGROUND OF THE INVENTION

1. Field of the Invention

The present invention relates to a method for cleaning a film formation apparatus.

2. Description of the Related Art

In recent years, researches on carbon materials such as a carbon nanotube, fullerene, graphene, and diamond which make full use of their features have been actively conducted all over the world. The carbon materials are industrially attractive in their features such as a small thermal expansion coefficient, high chemical resistance, and excellent electric conductivity and thermal conductivity.

Among these materials, attention has been particularly focused on graphene having a crystalline structure in which hexagonal skeletons of carbon are arranged in a plane form. Since graphene is one atomic plane extracted from a graphite crystal and has electrical, mechanical, or chemical characteristics which are outstanding, application of graphene has been expected in a variety of fields for, for example, a field-effect transistor with high mobility, a lithium ion secondary battery or a capacitor with high capacity and high output, a highly sensitive sensor, a highly-efficient solar cell, and a next-generation transparent conductive film, which use graphene. Although indium tin oxide (ITO) has been used for a transparent conductive film, there are growing concerns about depletion of indium, which is a constituent element, in the near future. For this reason, it is desirable to use carbon which is an abundant element on the earth as an alternative material.

Here, the graphene refers to one-atom-thick sheet of carbon molecules having π bonds or a stack in which a plurality of one-atom-thick sheets (the number of sheets is 2 to 100) of carbon molecules is stacked. In the case of the stack, an element other than carbon such as oxygen or hydrogen may be contained at a concentration less than or equal to 15 at. %.

As a method for industrially efficiently manufacturing such graphene, a thermal chemical vapor decomposition (CVD) method, in which graphene is formed over a metal catalyst, or the like has been attracting attention. The thermal CVD method is a kind of chemical vapor deposition (CVD) method, in which a thin film is formed using a decomposition product of a source gas caused by thermal energy, or chemical reaction. A metal catalyst is set in a reaction chamber heated to approximately 1000° C., and a hydrocarbon gas such as $CH_4$ (methane) or $C_2H_2$ (acetylene) flows into the reaction chamber as a film formation gas, so that the hydrocarbon gas is thermally decomposed; thus, graphene can be formed over the metal catalyst. Since thermal decomposition is less likely to occur in a gas such as methane or acetylene, it is necessary to use a catalyst to promote decomposition of the film formation gas. As the metal catalyst, nickel (Ni), copper (Cu), or the like is used. With the use of the thermal CVD method, graphene can be uniformly formed over a substrate having a large area; therefore, the thermal CVD method is an industrially optimal method for manufacturing graphene.

However, the thermal decomposition reaction of the film formation gas not only takes place on a surface of an object (metal catalyst) but also proceeds to the entire region in the reaction chamber including an inner wall, a jig, and the like in the reaction chamber. As a result, a product of the film formation gas, specifically, carbon with an amorphous structure is deposited in a film form on the inner wall or the like of the reaction chamber. The deposited carbon film becomes a contamination source such as a particle or soot when the reaction chamber is used again. Moreover, the deposited carbon film falls on the object during film formation, in a flake form, which causes significant deterioration in quality of the film to be formed. Further, the carbon film deposited on the inner wall of the reaction chamber becomes a cause of disturbing the set environment inside the reaction chamber: for example, the temperature control for keeping the temperature inside the reaction chamber to be stable may be disturbed.

For these reasons, the product deposited on the inner wall of a reactor or the like needs to be removed by etching (hereinafter referred to as cleaning) periodically or every film formation. In a conventional cleaning method, in a small-sized film formation apparatus, a carbon film is manually removed after the inside of the reaction chamber is exposed to the air. However, as the size of the apparatus increases, it becomes difficult to operate manually; therefore, a method in which an oxygen gas is introduced into the reaction chamber, so that the carbon film is oxidized to be a $CO_x$ gas and removed has been considered.

Patent Document 1 discloses a method of oxidizing and removing a substance attached to an inner wall or the like of a vacuum chamber after graphite nanofibers are formed by a thermal CVD method in a cold-wall type film formation apparatus which cools the wall of the vacuum chamber by a cooling medium provided in the periphery thereof. The attached substance is oxidized and removed by introducing 200-sccm air into the vacuum chamber and performing heat treatment at 600° C. for 2 minutes with an infrared lamp.

REFERENCE

[Patent Document 1] Japanese Published Patent Application No. 2002-15064

SUMMARY OF THE INVENTION

However, in the case of mass-producing graphene by the thermal CVD method, the cold-wall type film formation apparatus is not suitable. In the cold-wall type thermal CVD apparatus, the inner wall of the reaction chamber is cooled and only a substrate base is heated. Thus, in point of controlling the environment for film formation precisely, it is difficult to realize an apparatus structure for batch processing through which a plurality of objects is processed at the same time. In addition, the apparatus is made extremely cumbersome and complicated in order to realize this structure. Therefore, under present circumstances, the cold-wall type thermal CVD apparatus is limited to a single wafer apparatus in which objects are processed one by one. However, the single wafer cold-wall type thermal CVD apparatus is not suitable for mass production in its low throughput because one object is processed per processing.

Further, the quality of a film formed with the cold-wall type film formation apparatus is lower than that of a film formed with a hot-wall type film formation apparatus described later. This is because the temperature of vapor inside the reaction chamber cannot be uniformly maintained in the cold-wall type film formation apparatus.

Further, since only the substrate base is heated in the cold-wall type film formation apparatus, heating is not sufficient; therefore, an additional heating means such as an infrared heater needs to be provided in the apparatus. Thus, the structure of the apparatus is complicated, and might cause an increase in takt time by a time taken to increase and decrease the temperature when the controllability of the heating means is not sufficient.

Furthermore, in the case of using the air in heat treatment as disclosed in Patent Document 1 at the time of cleaning the carbon film attached to the inner wall or the like of the reaction chamber, although the air is the most familiar gas and inexpensive, it is not suitable because it dilutes oxygen for oxidation reaction, which reduces efficiency of the cleaning.

In view of the above, one of embodiments of the present invention is to provide a method for cleaning a hot-wall type film formation apparatus having a batch processing system with industrially high mass productivity. In the method, a carbon film deposited on an inner wall or the like of a reaction chamber of the apparatus can be removed efficiently in a short time.

One of embodiments of the present invention is a method for cleaning a hot-wall type film formation apparatus with a batch processing system in order to remove a carbon film deposited on an inner wall of a reaction chamber by a thermal CVD method. In the method, the reaction chamber is heated at a temperature higher than or equal to 700° C. and lower than or equal to 800° C., and oxygen is introduced into the reaction chamber.

The hot-wall type film formation apparatus is a film formation apparatus in which the entire reaction chamber is heated. The hot-wall type film formation apparatus has a structure of a batch processing system with high mass productivity, and vapor inside the reaction chamber can be uniformly maintained; therefore, a film of graphene or the like having good quality can be formed.

According to one of embodiments of the present invention, a method for cleaning a hot-wall type film formation apparatus having a batch processing system with industrially high mass productivity can be provided. In the method, a carbon film deposited on an inner wall or the like of a reaction chamber of the apparatus can be removed efficiently in a short time.

Further, according to one of embodiments of the present invention, a method for cleaning a hot-wall type film formation apparatus having a batch processing system with industrially high mass productivity can be provided. In the method, an alkali metal or an alkaline earth metal deposited on an inner wall or the like of a reaction chamber of the apparatus can be removed efficiently in a short time.

Furthermore, according to one of embodiments of the present invention, a field-effect transistor and a lithium secondary battery each using graphene and having high reliability and quality can be provided.

DETAILED DESCRIPTION OF THE INVENTION

Figure 1:
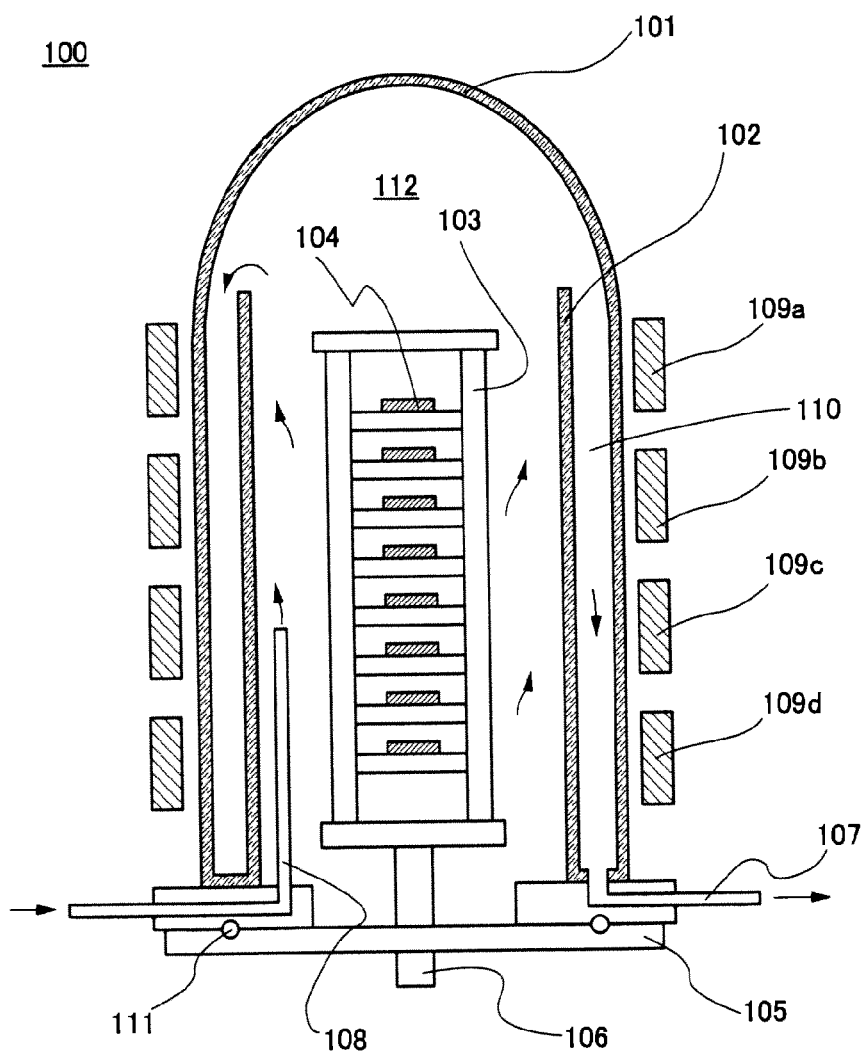
FIG. 1 illustrates an example of a structure of a film formation apparatus for carrying out a method of one of embodiments of the present invention.

Embodiments will be described below with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Note that the position, size, range, or the like of each structure illustrated in the drawings and the like is not accurately represented in some cases for easy understanding. Therefore, the present invention is not necessarily limited to the position, size, range, or the like disclosed in the drawings and the like.

Embodiment 1

In this embodiment, an example of a film formation apparatus of one of embodiments of the present invention is described with reference to FIG. 1 and FIG. 2.

Figure 2:
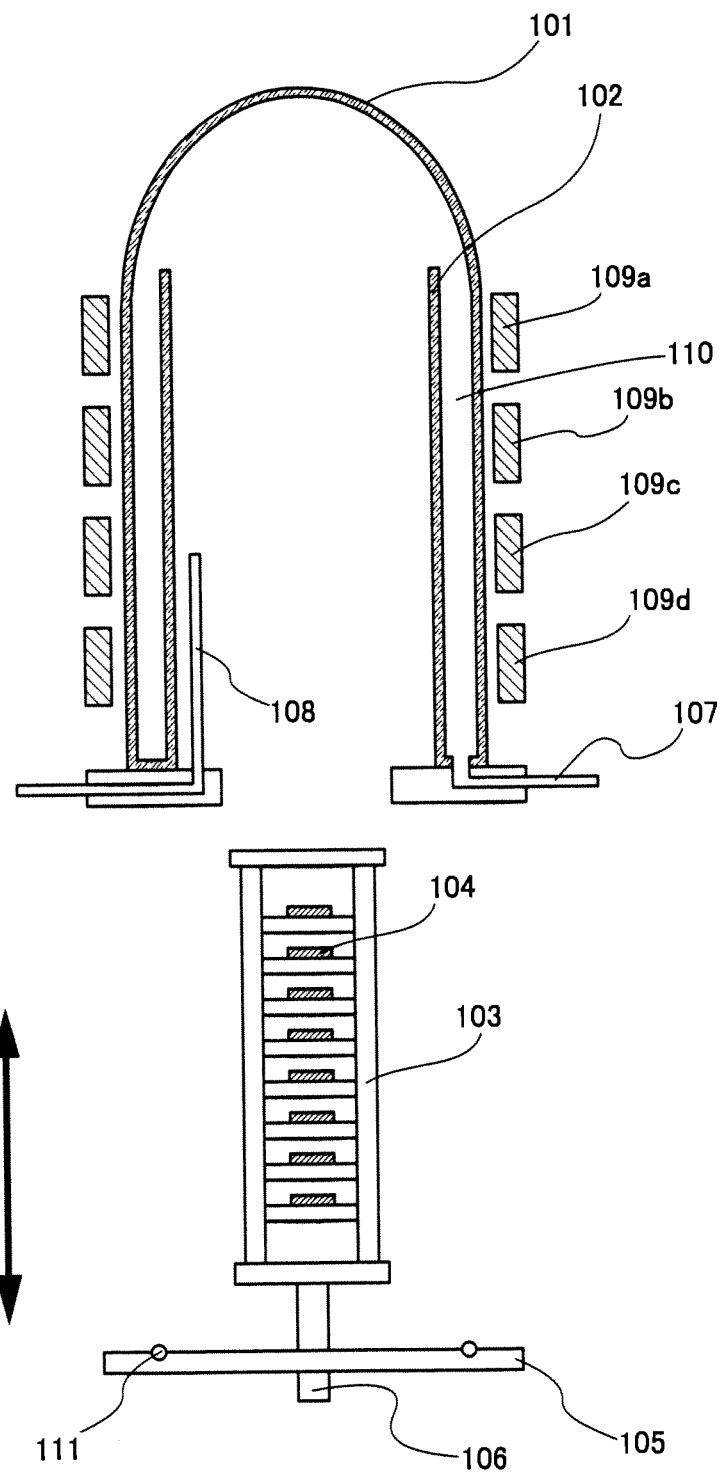
FIG. 2 illustrates an example of a structure of a film formation apparatus for carrying out a method of one of embodiments of the present invention.

FIG. 1 and FIG. 2 are diagrams each illustrating an example of a structure of a film formation apparatus that is one of embodiments of the present invention. A film formation apparatus 100 is an apparatus for forming a carbon material such as graphene by a thermal CVD method. As a film formation gas, a hydrocarbon gas of any of methane, ethane, propane, butane, ethylene, acetylene, propylene, and the like or combination of these gases, or a mixed gas of a gas containing carbon such as carbon monoxide or carbon dioxide and a hydrogen gas is supplied and heated; thus, the carbon material is formed on a surface of an object. For this purpose, the film formation apparatus 100 is configured as follows.

The film formation apparatus 100 includes a cylindrical outer tube 101 and a cylindrical inner tube 102, which is provided inside the outer tube 101 to be concentric with the outer tube 101. The outer tube 101 and the inner tube 102 compose a double-tube structure. Quartz glass with high heat resistance is preferably used for the outer tube 101 and the inner tube 102. Note that they are not limited to quartz glass, and instead, an aluminum alloy or stainless steel can be used. Further, a metal material such as copper, iron, zinc, chromium, titanium, manganese, silicon, magnesium, or an alloy of any of these metal materials and another metal can also be used. A gap 110 is provided between the outer tube 101 and the inner tube 102. A gas in a reaction chamber 112 is exhausted to an outlet 107 through the gap 110. An evacuation unit (not shown) including a vacuum pump such as a rotary pump, a turbo molecular pump, a mechanical booster pump, a cryopump, or the like is connected to the outlet 107.

A gas such as a film formation gas is supplied to the reaction chamber 112 through a gas feed nozzle 108. The number of gas feed nozzles 108 is one in FIG. 1 for convenience, but in the case of using a plurality of kinds of gases, a plurality of gas feed nozzles can be used as a matter of course. A gas feed nozzle for supplying a gas such as oxygen used for cleaning the reaction chamber 112 may be additionally provided. Although not shown, the gas feed nozzle 108 is connected to a gas supply source through a flow rate controller such as a mass flow rate controller (MFC) or a preheating portion. The flow rate controller has a function of adjusting a gas supplied to the reaction chamber to have a desired flow rate. Also in the case where two or more kinds of gases are mixed and introduced into the reaction chamber, the mixing ratio can be adjusted with the flow rate controller. To control the temperature in the reaction chamber 112, the preheating portion has a function of increasing the temperature of the gas supplied to the reaction chamber at around a predetermined temperature in advance outside the film formation apparatus 100.

An object supporting unit (boat) 103 in which a plurality of objects 104 is held in a multistage in the vertical direction is provided inside the inner tube 102. This structure enables batch processing that is a process through which 40 objects are processed at the same time, for example; thus, throughput can be drastically increased. As illustrated in FIG. 2, in order to carry the object 104 into/out of the film formation apparatus 100, the object supporting unit 103 is lifted up and down together with a lid 105, which is connected thereto through a rotation axis 106, in the vertical direction by a driving mechanism (not shown). The rotation axis 106 penetrates the lid 105, and supports the object supporting unit so that the object supporting unit can rotate.

Further, to increase the film quality of a carbon material, it is necessary to stabilize the environment in the reaction chamber at the time of film formation. For this reason, the lid 105 is provided with a sealing member 111 such as an O-ring to maintain the hermeticity of the reaction chamber 112.

Heating units 109a, 109b, 109c, and 109d such as resistance heating type heaters are provided on the periphery of the outer tube 101. The heating units 109a, 109b, 109c, and 109d are provided to surround the outer tube 101 in a circle, and each can control heating temperature independently. Thus, uniform temperature distribution can be maintained in the reaction chamber 112. FIG. 1 illustrates the four heating units 109a, 109b, 109c, and 109d but the number of heating units is not limited to this. Further, although not shown, a temperature monitoring unit for monitoring temperature in the temperature chamber 112 is provided therein. As the temperature monitoring unit, a thermocouple can be used, for example. Each of a plurality of temperature monitoring units is set in their predetermined regions, so that the temperature in each part of the reaction chamber can be measured appropriately and is fed back to the heating units; thus, the temperature distribution in the reaction chamber 112 can be controlled to be uniform. With such a hot-wall structure, the temperature in the reaction chamber can be made a temperature almost equal to the temperature of the object.

Here, in the film formation apparatus 100 illustrated in FIG. 1, the outer tube 101 has a diameter of 370 mm, a thickness of 4 mm, and a height of 1210 mm, the inner tube 102 has a diameter of 330 mm and a height of 1148 mm, and the reaction chamber 112 has a volumetric capacity of approximately 98 liters.

Embodiment 2

In this embodiment, a method for forming graphene with the film formation apparatus of one of embodiments of the present invention is described with reference to FIG. 1 and FIGS. 3A to 3E.

Figure 3A:
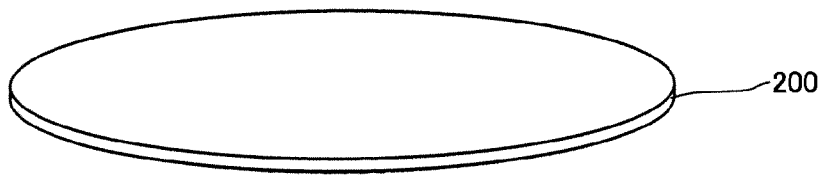
FIGS. 3A to 3E illustrate an example of manufacturing graphene.

FIG. 3A illustrates a substrate 200 used as the object 104. For the substrate 200, a silicon wafer, quartz, glass, stainless steel, copper, or ceramics can be used, for example. In particular, a member with heat resistance and high thermal conductivity is preferably used. It is particularly preferable that the substrate 200 on which graphene is formed have a flat surface.

Figure 3B:
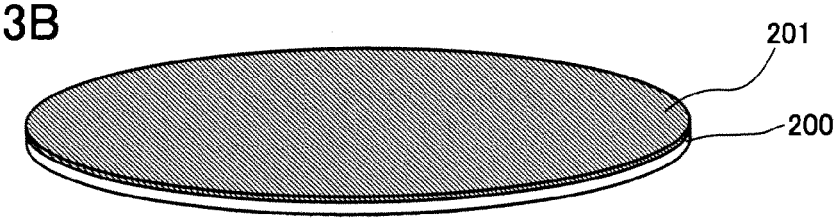

As illustrated in FIG. 3B, a metal catalyst layer 201 is formed on the substrate 200 by a sputtering method, a coating method, a plating method, an evaporation method, a spray method, a spin coating method, a dip coating method, or the like. For the metal catalyst layer 201, nickel (Ni), copper (Cu), cobalt (Co), iron (Fe), tin (Sn), zinc (Zn), chromium (Cr), aluminum (Al), titanium (Ti), indium (In), sulfur (S), molybdenum (Mo), platinum (Pt), gallium (Ga), sapphire ($Al_2O_3$), an alloy containing at least one of these substances, or the like is used. Although the metal catalyst layer 201 is directly formed on the substrate 200 here, a $SiO_2$ film formed by thermal oxidation or an insulating film formed by an evaporation method, a plasma CVD method, a sputtering method, an anodic oxidation method, an epitaxy method, an atomic layer deposition (ALD) method, or the like, such as a silicon oxide film, a silicon nitride film, a silicon nitride oxide film, a silicon oxynitride film, or an aluminum oxide film, may be provided as a base film (not shown) between the substrate 200 and the metal catalyst layer 201.

Figure 3C:
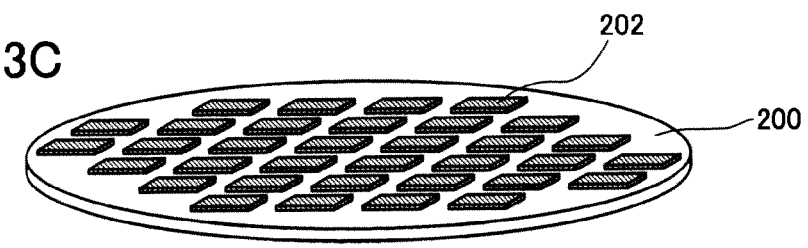

Next, as illustrated in FIG. 3C, the metal catalyst layer 201 is patterned by photolithography or the like and processed into a metal catalyst layer 202 with a desired shape.

As the object 104, the substrate 200 provided with the metal catalyst layer 202 which is patterned as described above is carried into the film formation apparatus 100 that is one of embodiments of the present invention. The object 104 is set in the object supporting unit 103 and then, carried into the reaction chamber 112 heated to a temperature higher than or equal to 400° C. and lower than or equal to 1000° C. by the heating units 109a, 109b, 109c, and 109d. Here, in the case where the heating temperature is set at a temperature lower than 400° C., which is a relatively low temperature, thermal decomposition of a hydrocarbon gas or the like does not occur, and in the case where the heating temperature is set at a high temperature exceeding 1000° C., the thermal decomposition excessively occurs. In both cases, graphene might not be appropriately formed. Further, a high temperature exceeding 1000° C. is not suitable for the heating temperature because the temperature exceeds the upper temperature limit of the substrate included in the object, and a jig or the like in the film formation apparatus might be oxidized or deteriorate.

Figure 3D:
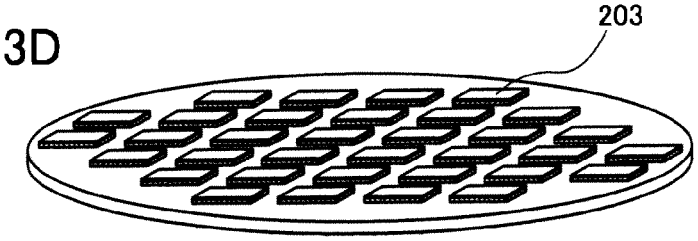

Then, as a film formation gas, a hydrocarbon gas of any of methane, ethane, propane, butane, ethylene, acetylene, propylene, and the like or a mixed gas of a gas containing carbon and a hydrogen gas is supplied from the gas feed nozzle 108 to the reaction chamber 112, and the hydrocarbon gas or the mixed gas is thermally decomposed, whereby graphene 203 is formed on the metal catalyst layer 202 (see FIG. 3D).

Figure 3E:
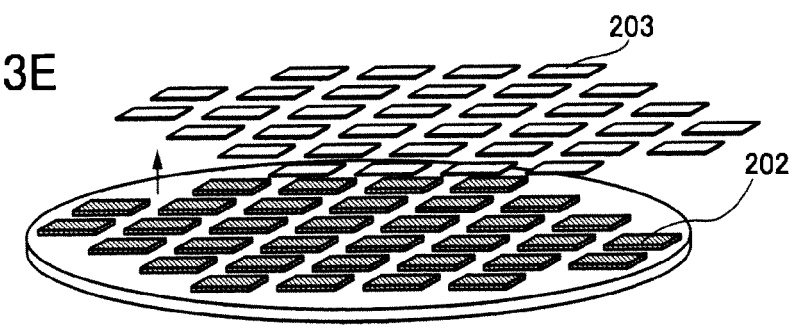

After the graphene 203 is formed, the graphene 203 on the object carried out of the film formation apparatus 100 can be taken out by bonding and transferring it to a resin substrate, for example (see FIG. 3E). The graphene 203 that is taken out can be used for a channel region of a field-effect transistor, a negative electrode active material or a coating material serving as a conductive additive for a positive electrode active material or the negative electrode active material in a lithium secondary battery, or the like, and thus can be applied to various devices. Alternatively, the graphene formed over the object can be used to form a transistor finally, for example.

Here, the above-mentioned thermal decomposition of the hydrocarbon gas occurs not only on a surface of the metal catalyst layer 202 but also in parts of the reaction chamber 112, such as a wall of the inner tube 102, a surface of the object supporting unit 103, and a surface of the gas feed nozzle 108, which are directly in contact with the hydrocarbon gas. Thus, a carbon film is secondarily formed over the surfaces and becomes a contamination source later.

In particular, in the hot-wall type film formation apparatus that is one of embodiments of the present invention, an inner wall of the outer tube 101 surrounding the object is heated; therefore, a carbon film to be a contamination source which is thicker than that in a cold-wall type film formation apparatus, in which an inner wall is not heated, is attached. For this reason, cleaning inside the reaction chamber 112, which is described in Embodiment 3, is necessary.

Further, in the case where an alkali metal such as lithium or an alkaline earth metal is contained in the object including the substrate, the metal catalyst layer, or the like, which is carried into the reaction chamber 112, the alkali metal or the alkaline earth meal is attached in the reaction chamber 112. Since lithium and the like is easily corroded and reacted, exposure to lithium and the like is very dangerous for human. For this reason, cleaning inside the reaction chamber 112, which is described in Embodiment 3, is necessary.

This embodiment can be implemented combining with other embodiments as appropriate.

Embodiment 3

In this embodiment, a method for cleaning the film formation apparatus described in Embodiment 1, which is one of embodiments of the present invention, is described.

As described in Embodiment 2, the thermal decomposition of the hydrocarbon gas occurs in the reaction chamber, the object supporting unit is carried out of the film formation apparatus and then, cleaning treatment is performed to remove an attached carbon film in the reaction chamber.

First, the reaction chamber 112 is heated to the chosen temperature for the cleaning treatment. The heating units 109a, 109b, 109c, and 109d are used for the heating. At this time, a predetermined flow rate such as 1 SLM of an inert gas such as a $N_2$ gas is preferably supplied.

After the temperature in the reaction chamber 112 reaches the chosen temperature, supply of an inert gas is stopped, and an oxygen ($O_2$) gas is supplied as a cleaning gas at a flow rate of 1 SLM, for example, to start the cleaning treatment. The pressure inside the reaction chamber is preferably at a predetermined value such as 40 Pa. Supply of oxygen to the reaction chamber 112 continues during the cleaning treatment. At the time of the cleaning treatment, the temperature of the reaction chamber 112 is higher than or equal to 700° C. and lower than or equal to 800° C., and heating treatment is performed for a time depending on the thickness of a carbon film attached to the inner wall of the reaction chamber. Consequently, a carbon film attached to an inner wall or the like of the inner tube 102 reacts with oxygen and vaporizes as $CO_x$; thus, the carbon film is removed by etching. Note that generated $CO_x$ is exhausted from the outlet 107. In such a manner, the cleaning treatment of the reaction chamber 112 is completed.

In the case where an alkali metal such as lithium or an alkaline earth metal is attached to the inner wall or the like of the inner tube 102, the alkali metal or the alkaline earth metal reacts with oxygen, is rendered harmless as a solid compound such as $LiO_2$, and is removed by etching.

The cleaning gas is not limited to the above-described oxygen ($O_2$) gas, and an ozone ($O_3$) gas can be used, for example. Since ozone has a high oxidizing ability and easily reacts with and decomposes an organic substance, ozone is particularly effective in removing the carbon film attached to the inner wall or the like of the inner tube 102 by etching. In the case of using ozone as the cleaning gas, equipment such as an ozone generating apparatus and a liquid ozone container need to be additionally provided in the film formation apparatus described in Embodiment 1. In particular, with the use of ozone under a reduced pressure, a mean free path of ozone in a gas phase becomes longer than that under an atmospheric pressure; therefore, thermal decomposition caused by collision of ozone molecules at high temperature can be reduced. Consequently, the carbon film can be decomposed and removed effectively.

In the case of using ozone as the cleaning gas, 100% ozone, with which the cleaning is most efficiently performed, may be used. Alternatively, in the case where the reaction chamber and a pipe serving as a pass are protected from oxidation, a mixed gas of ozone and an inert gas such as argon (Ar) may be used.

This embodiment can be implemented combining with other embodiments as appropriate.

Embodiment 4

In this embodiment, an example of manufacturing a top-gate field-effect transistor using the graphene formed in Embodiment 2 as a channel is described with reference to FIGS. 4A to 4E and FIGS. 5A to 5E.

First, a substrate 400 for manufacturing a transistor is prepared. For the substrate 400, a resin substrate formed of epoxy or the like can be used. In the case of using a flexible resin substrate, a transistor which is lightweight and flexible can be manufactured. However, since the resin substrate generally has low heat resistance, it should be noted that the temperature range that can be chosen in the manufacturing process of the transistor is limited. In addition, the substrate is not limited to the resin substrate, and a semiconductor such as silicon, glass, quartz, ceramics, or a metal such as stainless steel or aluminum can be selected as appropriate for the material of the substrate.

Next, an insulating film 401 formed of spin on glass (SOG) or the like is formed over the substrate 400. The insulating film 401 has an adhesion effect, which makes it possible to transfer graphene to the insulating film 401 by adhering to the graphene. A transfer step is performed as follows: the substrate 400 and the substrate 200 described in Embodiment 2, over which the graphene 203 is formed, are faced and bonded to each other. At this time, the graphene 203 is secured to the insulating film 401, and then peeled from the metal catalyst layer 202 by separating the substrate 200 and the substrate 400; thus, the graphene 203 shown in FIG. 3D is transferred to the substrate 400 as a grapheme 402 with the insulating film 401 provided therebetween (see FIG. 4A). Note that after the graphene is peeled from the substrate 200 provided with the metal catalyst layer 202, the substrate 200 can be reused after being subjected to a predetermined process such as cleaning.

The graphene 402 transferred to the substrate 400 has substantially the same shape as the metal catalyst layer 202 which is patterned and processed into the desired shape in Embodiment 2. Moreover, in the case of patterning the graphene 402 into a fine shape, the graphene 402 can be processed into a desired shape in the following manner: after a photoresist is applied, a pattern is exposed to light and developed with a light exposure apparatus such as an electron beam exposure apparatus, and only exposed part of the graphene 402 is removed by etching. In particular, in the case where attachment of an end portion of the graphene 402 to the insulating film 401 is not sufficient when the graphene 402 is transferred to the substrate 400, another processing for removing the end portion which is not attached is effective in manufacturing a highly reliable field-effect transistor.

Note that the insulating film 401 can also have a function of preventing a contamination source from entering the substrate 400 or a function of stress relaxation of the substrate 400 and the graphene 402.

Figure 4A:
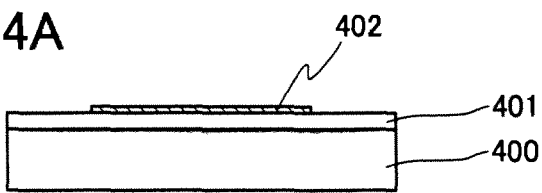
FIGS. 4A to 4E illustrate an example of a field-effect transistor using graphene.
Figure 4B:
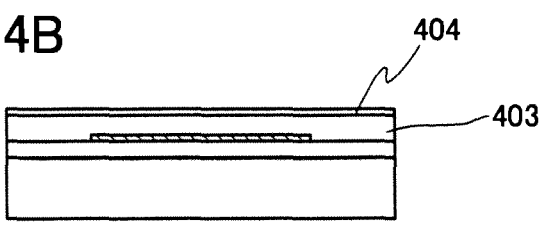

Next, insulating films 403 and 404 are formed to cover the graphene 402 transferred to the substrate 400 with the insulating film 401 provided therebetween (see FIG. 4B). Between a gate electrode 405 formed later and the graphene 402, the insulating films 403 and 404 serve as a gate insulating film of the field-effect transistor. The insulating film 403 is formed using an insulator including a high molecular material by a spin coating method. The use of the spin coating method prevents damage to the graphene 402, which is caused by using a sputtering method or a CVD method. In addition, projections and depressions on a surface of the insulating film 403 due to the graphene 402 are covered and the surface can be flattened by forming the insulating film 403 by the spin coating method.

The insulating film 404 over the insulating film 403 is formed by a sputtering method or a plasma CVD method. For the insulating film 404, an insulating material such as silicon oxide, silicon nitride, or silicon oxynitride can be used. The insulating film 404 serves as an etching stopper when the gate electrode 405 formed in the later step is processed. In addition, the insulating film 404 also serves as a protection film which prevents a contamination source from entering the graphene 402.

Next, the gate electrode 405 is formed over the insulating film 404 by photolithography and etching. As a material of the gate electrode 405, a metal such as aluminum, tungsten, titanium, molybdenum, chromium, copper, or gold; an alloy any of these metals; silicide; polycrystalline silicon; a combination of silicide and polycrystalline silicon; or the like can be used.

An insulating film 406 serving as a protection film is formed over the gate electrode 405. For the insulating film 406, an insulating material such as silicon oxide, silicon nitride, or silicon oxynitride can be used. After the insulating film 406 is formed, an insulating film 407 is formed over the insulating film 406 (see FIG. 4C). The insulating film 407 is preferably a low dielectric constant film. For the insulating film 407, a silicon oxide film, a SOG film, or the like can be used. An organic material may be used for the insulating film 407. The insulating film 407 may be porous. The insulating film 407 preferably has a flat surface. Although a layered structure of the insulating film 406 and the insulating film 407 is formed over the gate electrode 405 in this embodiment, one of the insulating films may be omitted or another functional layer may be stacked.

Figure 4C:
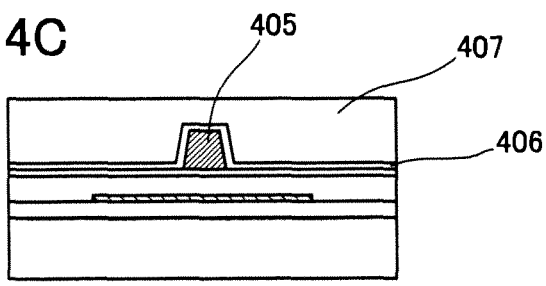
Figure 4D:
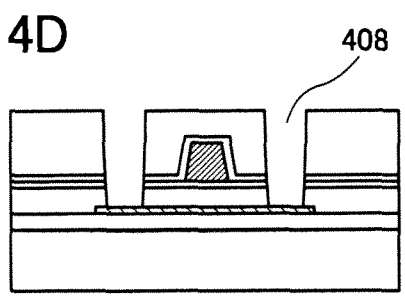

Next, as illustrated in FIG. 4D, a through hole 408 penetrating the insulating films 403, 404, 406, and 407 is formed to reach the graphene 402. Dry etching such as reactive ion etching (RIE) or wet etching can be used to form the through hole 408 in the insulating films 403, 404, 406, and 407.

Next, a plug 409 is formed in the through hole 408. For the plug 409, a metal such as tungsten or an alloy material can be used. A metal is embedded in the through hole 408 by a sputtering method, a CVD method, or the like, and then a top surface of the metal is flattened by a chemical mechanical polishing (CMP) method, whereby the plug 409 is formed.

Although not shown, a barrier layer including titanium, titanium nitride, or the like is preferably formed on a side surface of the plug. An etching-stop film is preferably provided as an upper layer of the insulating film 407 for CMP. After the plug 409 is formed, a source wiring or drain wiring 410 is formed using a conductive material (see FIG. 4E). As the conductive material, a metal material having low resistance, such as aluminum or copper, can be used.

Through the above manufacturing steps, the field-effect transistor using graphene is manufactured. Thus, a transistor which makes full use of the features of the graphene to have high electron mobility and hole mobility and to drive at low voltage with low power consumption can be manufactured.

Figure 4E:
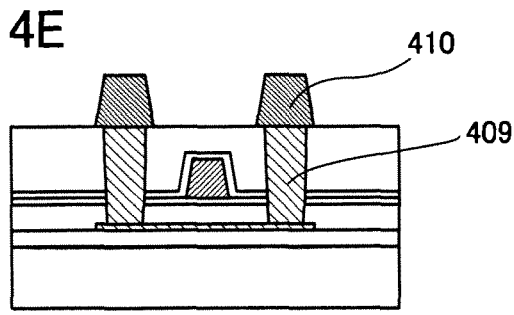

Next, a transistor with a structure different from that of the field-effect transistor illustrated in FIG. 4E is described with reference to FIGS. 5A to 5E. A field-effect transistor illustrated in FIG. 5E is a top-gate transistor, which is similar to the transistor illustrated in FIG. 4E; however, the transistor in FIG. 5E is different from that in FIG. 4E in that the metal catalyst layer used to form the graphene in Embodiment 2 is used. Other than the above, the field-effect transistor illustrated in FIG. 5E is similar to that illustrated in FIG. 4E, and a material similar to that of the transistor in FIG. 4E can be used for the transistor in FIG. 5E.

Figure 5A:
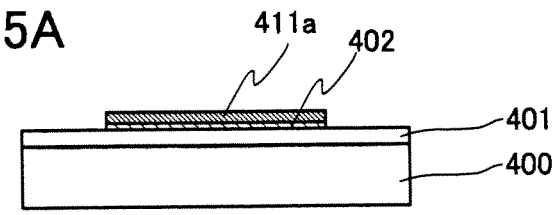
FIGS. 5A to 5E illustrate an example of a field-effect transistor using graphene.
Figure 5B:
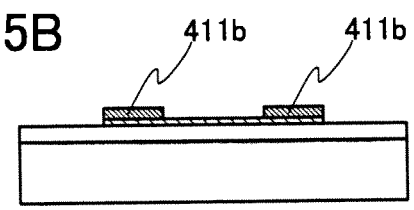

FIG. 5A illustrates a substrate to which the graphene 402 is transferred. When the graphene 402 is transferred, a metal catalyst layer 411a (202 shown in FIG. 3C) used for forming the graphene also adheres on the substrate. For this reason, a separation layer needs to be provided on a surface of the metal catalyst layer 411a opposite to a surface in contact with the graphene 402 in advance. The graphene 402 is transferred to the substrate 400 together with the metal catalyst layer 411a with the insulating film 401 provided therebetween; thus, when only the graphene 402 is transferred, a crease that might be formed in the graphene can be suppressed.

Next, the metal catalyst layer 411a is processed into a desired shape by photolithography and wet etching. Although it is possible to remove the metal catalyst layer 411a entirely, a metal catalyst layer 411b remains in a portion in contact with a source or a drain of the transistor here (see FIG. 5B). This is because the pattern of the remaining metal catalyst layer 411b serves as an etching stopper in a step for forming a through hole in insulating films, which is performed later, and protects the graphene 402. An acid-based wet etchant is used in etching the metal catalyst layer 411a; therefore, damage to the graphene 402 can be prevented.

Figure 5C:
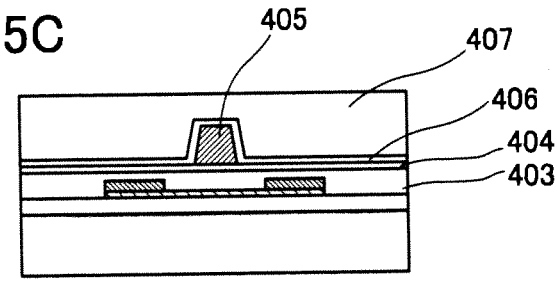

Then, in a manner similar to that in the manufacturing process of the transistor illustrated in FIGS. 4B and 4C, the insulating films 403 and 404 serving as gate insulating films, the gate electrode 405, and the insulating films 406 and 407 covering the gate electrode 405 are formed (see FIG. 5C).

Figure 5D:
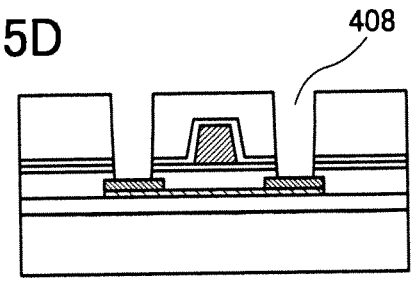
Figure 5E:
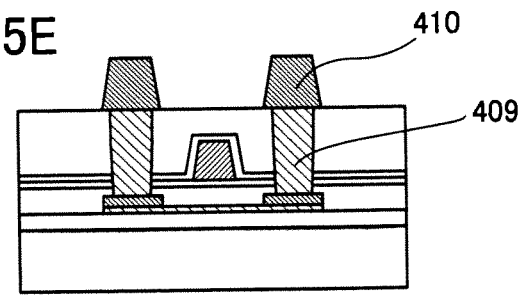

Next, as illustrated in FIG. 5D, the through hole 408 for connecting a source wiring or drain wiring formed later to the transistor is formed in the insulating films 406 and 407. In the case where dry etching such as reactive ion etching (RIE) is used for forming the through hole 408, the graphene 402 might be damaged; however, the graphene 402 can be protected when the pattern of the metal catalyst layer 411b remains directly under the through hole 408. Further, the metal catalyst layer 411b also serves as an etching stopper.

After the through hole 408 is formed, the plug 409 and the source wiring or drain wiring 410 are formed in a manner similar to that in the manufacturing process of the transistor illustrated in FIG. 4E (see FIG. 5E).

With the use of graphene formed in the reaction chamber of the film formation apparatus subjected to the cleaning treatment described in Embodiment 3 as the graphene used in this embodiment, a field-effect transistor with high reliability including a channel comprising graphene to which contaminants are not mixed can be manufactured.

This embodiment can be implemented combining with other embodiments as appropriate.

Embodiment 5

In this embodiment, an example of manufacturing a lithium secondary battery using the graphene formed in Embodiment 2 is described.

Here, a lithium secondary battery refers to a secondary battery using lithium ions as carrier ions. Although the example of manufacturing the lithium secondary battery is described in this embodiment, the secondary battery is not limited to the secondary battery using lithium. Instead of lithium ions, ions of an alkali metal such as sodium or potassium; ions of an alkaline earth metal such as calcium, strontium, or barium; beryllium ions; or magnesium ions can be used as the carrier ions.

First, graphene is formed on a metal catalyst layer in a manner similar to that described in Embodiment 2 and then, the metal catalyst layer is etched by acid or the like, whereby a single film of the graphene is obtained. The obtained film is cut and processed into rectangles in which the length of one side is 1 μm to 100 μm.

In cutting of the obtained single film of the graphene, a layer of active material particles, which is to be mixed with the single film of the graphene later, is preferably applied onto one surface of the single film of the graphene with a thickness of 10 nm to 100 nm. Although the graphene is likely to aggregate after being cut, aggregation can be prevented by providing a layer of another material on one surface thereof.

The graphene having an appropriate area formed in the above manner is mixed with a positive electrode active material and a binder, whereby a slurry is obtained. Other conductive additives such as acetylene black may be additionally mixed as appropriate.

As the material of the positive electrode active material, a compound such as $LiFeO_2$, $LiCoO_2$, $LiNiO_2$, $LiMn_2O_4$, $V_2O_5$, $Cr_2O_5$, or $MnO_2$ can be used.

Alternatively, an olivine-type lithium-containing composite oxide (a general formula $LiMPO_4$ (M is one or more of Fe(II), Mn(II), Co(II), and Ni(II))) can be used. Typical examples of the general formula $LiMPO_4$ which can be used as the material are lithium compounds such as $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ (a+b≤1, 0<a<1, and 0<b<1), $LiFe_cNi_dCo_ePO_4$, $LiFe_cNi_dMn_ePO_4$, $LiNi_cCo_dMn_ePO_4$ (c+d+e≤1, 0<c<1, 0<d<1, and 0<e<1), and $LiFe_fNi_gCo_hMn_iPO_4$ (f+g+h+i≤1, 0<f<1, 0<g<1, 0<h<1, and 0<i<1).

Further alternatively, a composite oxide such as a general formula $Li_{(2-j)}MSiO_4$ (M is one or more of Fe(II), Mn(II), Co(II), and Ni(II); 0≤j≤2) can be used. Typical examples of the general formula $Li_{(2-j)}MSiO_4$ which can be used as the material are compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ (k+l≤1, 0<k<1, and 0<l<1), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ (m+n+q≤1, 0<m<1, 0<n<1, and 0<q<1), and $Li_{(2-j)}Fe_rNi_sCo_tMn_uSiO_4$ (r+s+t+u≤1, 0<r<1, 0<s<1, 0<t<1, and 0<u<1).

Each of particles of these lithium compounds preferably has a size within the range of 20 nm to 100 nm. Further, a carbohydrate such as glucose may be mixed at the time of baking of the positive electrode active material particles, so that the positive electrode active material particles are coated with graphene. This treatment can improve the conductivity.

Figure 6A:
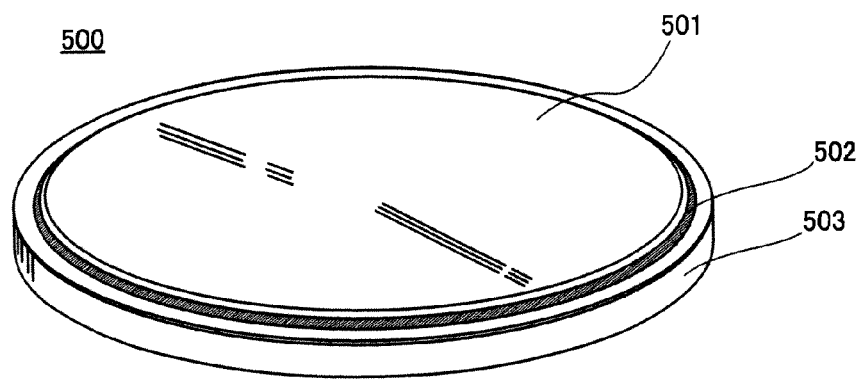
FIGS. 6A and 6B illustrate an example of a coin-type secondary battery using graphene.
Figure 6B:
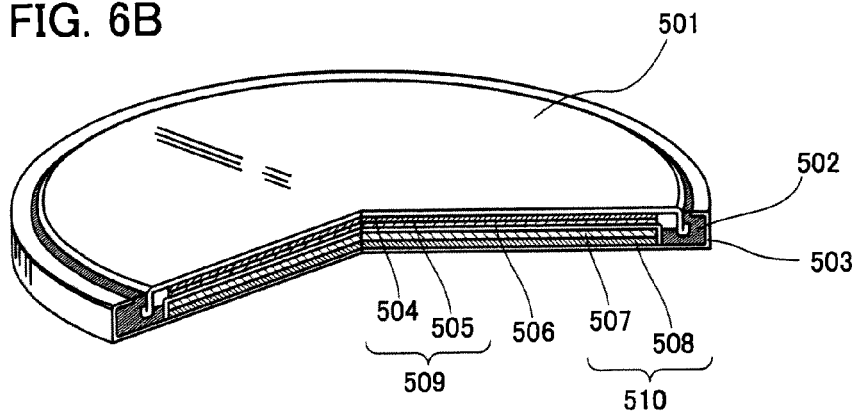

Description will be made below with reference to FIGS. 6A and 6B. FIGS. 6A and 6B are schematic diagrams each illustrating a structure of a coin-type (single-layer flat) lithium secondary battery. The above-described slurry is applied onto a positive electrode current collector 508 included in a positive electrode 510, molded, and then dried, whereby a positive electrode active material layer 507 is formed.

For the positive electrode current collector 508, a highly conductive material such as a metal typified by stainless steel, gold, platinum, zinc, iron, copper, aluminum, or titanium, or an alloy of these metals can be used. Further, for the positive electrode current collector 508, an aluminum alloy to which an element which improves heat resistance, such as silicon, titanium, neodymium, scandium, or molybdenum, is added can be used. Furthermore, for the positive electrode current collector 508, a metal element which forms silicide by reacting with silicon may be used. Examples of the metal element which forms silicide by reacting with silicon include zirconium, titanium, hafnium, vanadium, niobium, tantalum, chromium, molybdenum, tungsten, cobalt, nickel, and the like. The positive electrode current collector 508 can have a foil-like shape, a plate-like shape (sheet-like shape), a net-like shape, a punching-metal shape, an expanded-metal shape, or the like as appropriate.

The positive electrode active material layer 507 is not necessarily formed directly on the positive electrode current collector 508. Between the positive electrode current collector 508 and the positive electrode active material layer 507, a functional layer such as an adhesive layer for improving the adhesion between the positive electrode current collector 508 and the positive electrode active material layer 507, a planarization layer for reducing an uneven shape on a surface of the positive electrode current collector 508, a dissipation layer for dissipating heat, or a stress relaxation layer for relaxing stress of the positive electrode current collector 508 or the positive electrode active material layer 507 may be formed using a conductive material such as a metal.

As illustrated in FIG. 6A, in a coin-type lithium secondary battery 500, a positive electrode can 503 serving as a positive electrode terminal and a negative electrode can 501 serving as a negative electrode terminal are sealed and insulated with a gasket (insulation packing) 502 formed of polypropylene or the like. As described above, the positive electrode 510 includes the positive electrode current collector 508 and the positive electrode active material layer 507 being in contact therewith. On the other hand, a negative electrode 509 includes a negative electrode current collector 504 and a negative electrode active material layer 505 being in contact therewith. A separator 506 and an electrolyte (not shown) are included between the positive electrode active material layer 507 and the negative electrode active material layer 505. For the positive electrode 510, the positive electrode active material layer 507 formed through the above-described process is used.

For a solute of the electrolyte, a material including carrier ions is used. Typical examples of the solute of the electrolyte include lithium salts such as $LiClO_4$, $LiAsF_6$, $LiBF_4$, $LiPF_6$, and $Li(C_2F_5SO_2)_2N$.

Note that when the carrier ions are alkali metal ions other than lithium ions, alkaline-earth metal ions, beryllium ions, or magnesium ions, instead of lithium in the above lithium salts, an alkali metal (e.g., sodium or potassium), an alkaline-earth metal (e.g., calcium, strontium, or barium), beryllium, or magnesium may be used for the solute of the electrolyte.

As a solvent of the electrolyte, a material in which the carrier ions can transfer is used. As the solvent of the electrolyte, an aprotic organic solvent is preferably used. Typical examples of the aprotic organic solvent include ethylene carbonate (EC), propylene carbonate, dimethyl carbonate, diethyl carbonate (DEC), γ-butyrolactone, acetonitrile, dimethoxyethane, tetrahydrofuran, and the like, and one or more of these materials can be used. With the use of a gelled high-molecular material as the solvent of the electrolyte, safety against liquid leakage and the like is improved. Further, the lithium-ion secondary battery can be thinner and more lightweight. Typical examples of the gelled high-molecular material include a silicone gel, an acrylic gel, an acrylonitrile gel, polyethylene oxide, polypropylene oxide, and a fluorine-based polymer. Alternatively, the use of one or more of ionic liquids (room temperature molten salts) which are less likely to burn and volatilize as the solvent of the electrolyte can prevent the power storage device from exploding or catching fire even when the power storage device internally shorts out or the internal temperature increases due to overcharging or the like.

As the electrolyte, a solid electrolyte such as $Li_3PO_4$ can be used.

The negative electrode 509 includes the negative electrode active material layer 505 over the negative electrode current collector 504. As the negative electrode current collector 504, copper may be used, for example. As a negative electrode active material, graphite, polyacene, or the like is used. The negative electrode active material layer 505 is preferably formed using such a material alone or a mixture of the material and a binder. Alternatively, graphene obtained by any of the above methods may be used as the negative electrode active material.

For the separator 506, cellulose (paper) or an insulator with pores, such as polypropylene or polyethylene, can be used.

For the positive electrode can 503 and the negative electrode can 501, a metal which is resistant to corrosion, such as nickel, aluminum, or titanium; an alloy of any of these metals; or an alloy of any of these metals and another metal (e.g., stainless steel) can be used. In particular, a metal which is corrosive is preferably plated with nickel or the like in order to prevent corrosion which is caused by an electrolyte when a secondary battery is charged or discharged. The positive electrode can 503 and the negative electrode can 501 are electrically connected to the positive electrode 510 and the negative electrode 509, respectively.

The negative electrode 509, the positive electrode 510, and the separator 506 are impregnated with the electrolyte. As illustrated in FIG. 6B, the positive electrode 510, the separator 506, the negative electrode 509, and the negative electrode can 501 are stacked over the positive electrode can 503 in this order. Then, the positive electrode can 503 and the negative electrode can 501 are subjected to pressure bonding with the gasket 502 interposed therebetween. In such a manner, the coin-type lithium secondary battery 500 is manufactured.

Figure 7A:
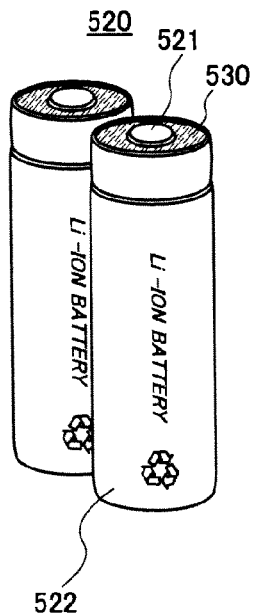
FIGS. 7A and 7B illustrate an example of a cylindrical secondary battery using graphene.

Next, a structure of a cylindrical lithium secondary battery will be described with reference to FIGS. 7A and 7B. As illustrated in FIG. 7A, a cylindrical lithium secondary battery 520 includes a positive electrode cap (battery lid) 521 on its top surface and a battery can (exterior can) 522 on its side surface and bottom surface. The positive electrode cap and the battery can (exterior can) 522 are insulated from each other by a gasket (insulation packing) 530.

Figure 7B:
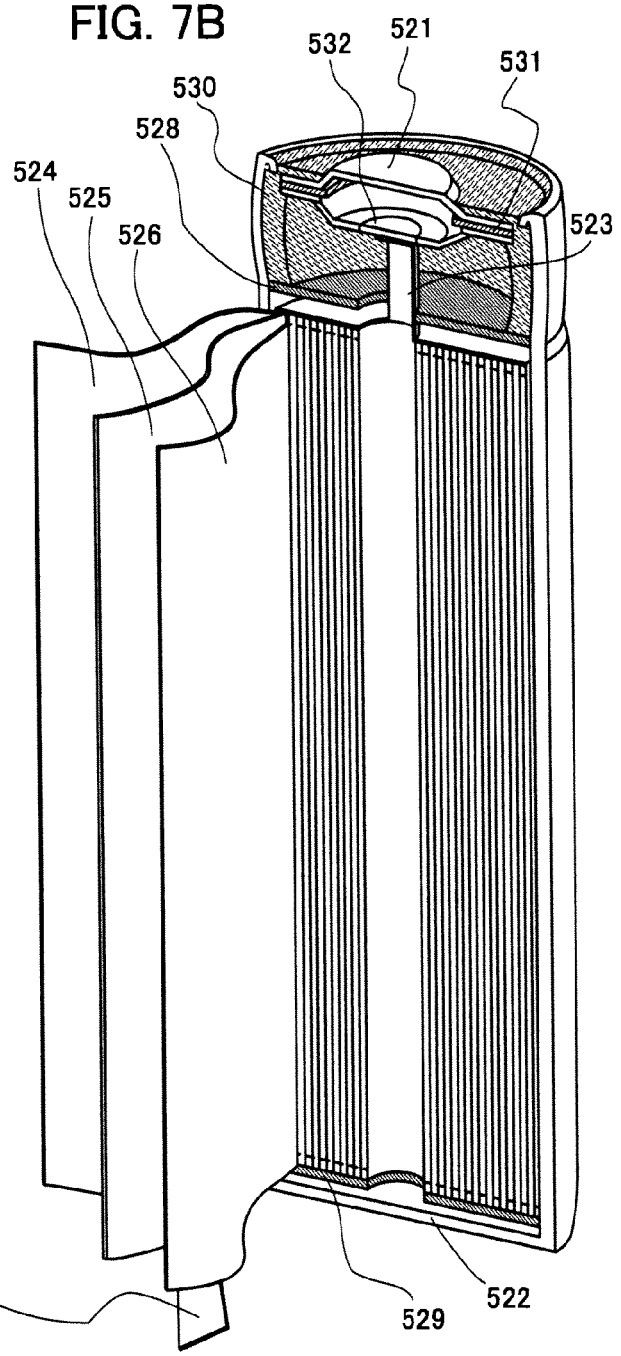

FIG. 7B is a schematic diagram illustrating a cross section of the cylindrical lithium secondary battery. In the battery can 522 with a hollow cylindrical shape, a strip-like positive electrode 524 and a strip-like negative electrode 526 are rolled up with a separator 525 provided therebetween to form a battery element. Although not shown, the battery element winds around a center pin. The battery can 522 is closed at one end and opened at the other end. For the battery can 522, a metal which is resistant to corrosion, such as nickel, aluminum, or titanium; an alloy of these metals; or an alloy of any of these metals and another metal (e.g., stainless steel) can be used. In particular, a metal which is corrosive is preferably plated with nickel or the like in order to prevent corrosion which is caused by an electrolyte when a secondary battery is charged or discharged. In the battery can 522, the battery element including the positive electrode, the negative electrode, and the separator, which are rolled up, is sandwiched between a pair of insulating plates 528 and 529 facing each other. Further, the battery can 522 including the battery element is filled with an electrolyte (not shown). As the electrolyte, an electrolyte similar to that in the coin-type lithium secondary battery can be used.

The positive electrode 524 and the negative electrode 526 can be manufactured in a manner similar to those of the positive electrode and the negative electrode of the coin-type lithium secondary battery described above, except for a step where an active material is applied on both sides of a current collector and then, the current collector is rolled up and molded with a pressing machine and dried. This is because the positive electrode and the negative electrode used in the cylindrical lithium secondary battery are rolled up. The graphene formed in Embodiment 2 is mixed into each of the active materials included in the positive electrode and the negative electrode, so that the secondary battery can have improved reliability. A positive electrode terminal (positive electrode current collecting lead) 523 is connected to the positive electrode 524, and a negative electrode terminal (negative electrode current collecting lead) 527 is connected to the negative electrode 526. For the positive electrode terminal 523 and the negative electrode terminal 527, a metal material such as aluminum can be used. The positive electrode terminal 523 and the negative electrode terminal 527 are resistant welded to a safety valve mechanism 532 and a bottom of the battery can 522, respectively. The safety valve mechanism 532 is electrically connected to the positive electrode cap 521 through a positive temperature coefficient (PTC) element 531. In the case where an internal pressure of the battery is increased to exceed a predetermined threshold value, the safety valve mechanism 532 electrically disconnects the positive electrode cap 521 and the positive electrode 524. The PTC element 531 is a heat sensitive resistor whose resistance increases as temperature rises, and controls the amount of current by increase in resistance to prevent unusual heat generation. For the PTC element, a barium titanate ($BaTiO_3$)-based semiconductor ceramic or the like can be used.

The coin-type lithium secondary battery 500 and the cylindrical lithium secondary battery 520 which are manufactured as described above can be used in various small-sized devices such as a clock, a calculator, a small-sized game machine, an IC tag, an IC card, an electronic thermometer, an electronic notebook, a personal digital assistant (PDA), an e-book reader, and a power supply for memory backup.

Note that in this embodiment, the coin-type lithium secondary battery and the cylindrical lithium secondary battery are given as the lithium secondary batteries; however, any of lithium secondary batteries with various shapes, such as a sealing-type lithium secondary battery and a square-type lithium secondary battery can be used. Further, a structure in which a plurality of positive electrodes, a plurality of negative electrodes, and a plurality of separators are stacked or rolled up may be employed.

This embodiment can be implemented combining with other embodiments as appropriate.

Example 1

In this example, specific conditions for cleaning treatment of a carbon film deposited on an inner wall of a reaction chamber is described with reference to FIG. 8.

With the use of the film formation apparatus described in Embodiment 1, appropriate conditions for cleaning treatment in the film formation apparatus were investigated. Samples were each prepared by forming a carbon film on a titanium foil in order to reproduce a carbon film attached to the inner wall of the film formation apparatus. A titanium foil with an outside diameter of 1 cm was used, and an approximately 60-nm-thick carbon film with an amorphous structure was deposited thereon. The titanium foil corresponds to a component of the inner wall of the film formation apparatus. The carbon film on the titanium foil corresponds to a carbon film to be a contamination source which is attached to and deposited on the inner wall or the like of the film formation apparatus by depositing a carbon material such as graphene by a thermal CVD method. With the sample, temperature dependence of oxygen etching (i.e., cleaning) of the carbon film was measured.

Five samples manufactured under the same condition as the above sample were prepared. Four of the samples were subjected to cleaning treatment at 500° C., 600° C., 700° C., and 800° C., respectively. The other one was not subjected to cleaning treatment, and used as a reference sample.

In the cleaning treatment, the pressure of the reaction chamber was 40 Pa, the flow rate of oxygen that is an etching gas was 1 SLM, and heat treatment was performed for 1 hour.

Figure 8:
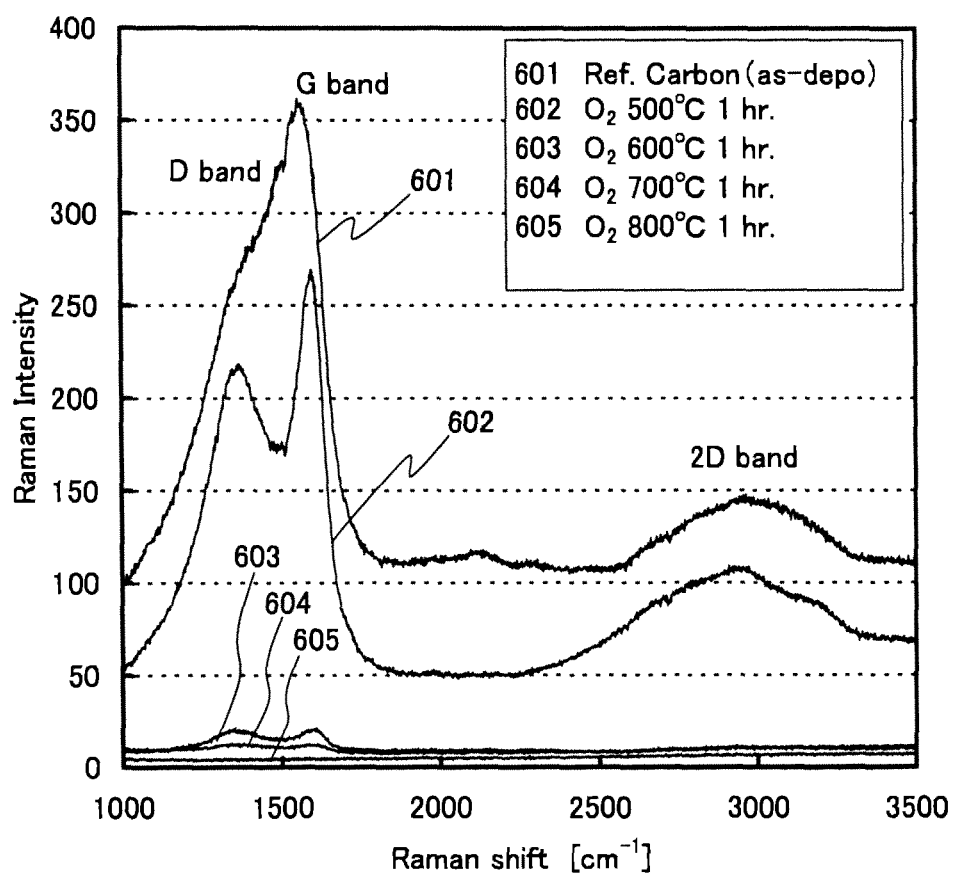
FIG. 8 is a graph showing a relation between cleaning temperature and peak intensity, which is peculiar to a carbon film.

FIG. 8 shows measurement results of the Raman spectroscopic analysis which shows temperature dependence of oxygen etching of the carbon film. The horizontal axis represents the Raman shift (wave number) and the vertical axis represents the Raman intensity. A surface of each of the five samples was irradiated with laser light, and reflected light or scattered light from the surface was detected to measure the Raman intensity of the carbon film; thus, the extent of removal of the carbon film was evaluated.

In general, Raman spectrum of a carbon material has peaks at around 1330 $cm^{-1}$, 1580 $cm^{-1}$, and 2800 $cm^{-1}$, respectively. The peaks are called the D band, the G band, and the 2D band. Since the carbon film in a surface of the reference sample was not removed, a solid line 601 showing the Raman spectrum of the reference sample indicates the highest Raman intensity overall. In contrast, a solid line 602 showing the Raman spectrum of the sample subjected to oxygen etching at 500° C. indicates a lower Raman intensity overall. From the Raman spectra of the reference sample and the sample, it is found that the carbon film was removed by oxygen etching in the sample. However, the measured Raman intensity was still high, which shows that part of the carbon film was not removed and remained. A solid line 603 shows the Raman spectrum of the sample subjected to oxygen etching at 600° C. The Raman intensity of the sample is much lower than that of the sample subjected to oxygen etching at 500° C. In addition, the 2D band is not seen in the solid line 603. Although this shows an increase in removal of the carbon film, the carbon film was not completely removed because peaks can be seen in the vicinity of the D band and the G band in the spectrum. A solid line 604 shows the Raman spectrum of the sample subjected to oxygen etching at 700° C. In contrast to the solid line 603, there are almost no Raman peaks showing the D band and the G band in the solid line 604. Moreover, the D band, the G band, and the 2D band, which are typically shown in the Raman spectrum of the carbon film, are not seen in a solid line 605 showing the sample subjected to oxygen etching at 800° C., which shows that the carbon film was completely removed.

It was revealed from the above measurement results that cleaning of the reaction chamber of the film formation apparatus described in Embodiment 1 can be achieved by performing etching with the use of oxygen at a temperature higher than or equal to 700° C. and lower than or equal to 800° C.

Note that it was confirmed that the reaction chamber of the film formation apparatus can be cleaned by performing oxygen etching at a temperature higher than or equal to 800° C. In the case of cleaning treatment at a temperature 800° C. or higher, it takes 5 hours or more to decrease the temperature from 800° C. to 200° C.; therefore, the cleaning treatment may be performed at a temperature 800° C. or higher only in the case where adequate cleaning treatment is needed. With oxygen etching at a temperature higher than or equal to 700° C. and lower than or equal to 800° C., the film formation apparatus can be cleaned at the lowest possible temperature in minimal time.

Further, the results in this example show that in the case of oxygen etching at 800° C., the carbon film was able to be removed to such an extent that it cannot be detected by the Raman spectroscopic analysis. However, deposition of a carbon film on the inner wall or the like of the reaction chamber cannot be avoided because of the structure of the hot-wall type film formation apparatus. Therefore, during the formation of a carbon film, which is an object to be formed, the carbon film is also attached on the inner wall or the like, but a minute amount of attachment by which a flake or the like is not generated is allowed. For this reason, it is also suggested that throughput of the whole of the film formation treatment can be improved by limiting the temperature of the cleaning treatment to around 700° C. to shorten the time for decreasing the temperature of the reaction chamber.

Further, although the cleaning treatment time was 1 hour in this example, it is apparent that results of cleaning treatment performed for a time more than 1 hour are equal to those of the cleaning treatment performed for 1 hour.

Example 2

It was apparent from the measurement results described in Example 1 that the cleaning of the reaction chamber of the film formation apparatus can be achieved by performing etching with the use of oxygen at a temperature higher than or equal to 700° C. and lower than or equal to 800° C. Therefore, experiments were conducted to determine the shortest time for sufficiently cleaning the reaction chamber at 700° C. and 800° C.

Figure 9:
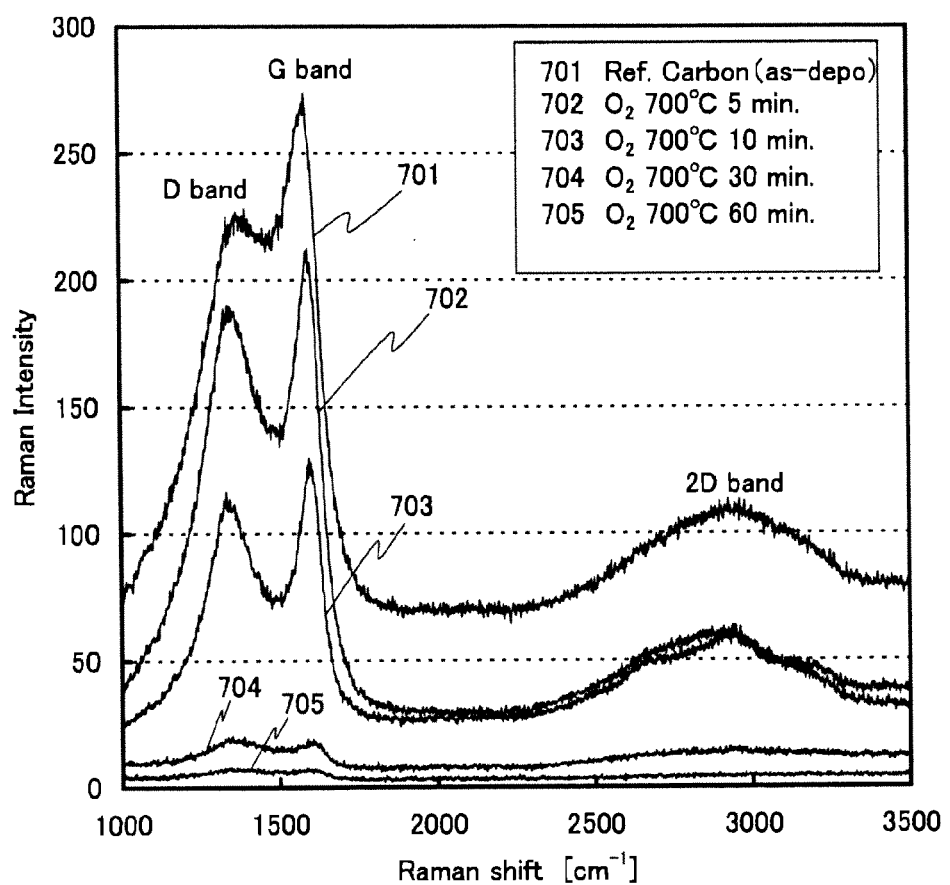
FIG. 9 is a graph showing a relation between cleaning time at 700° C. and peak intensity, which is peculiar to a carbon film.
Figure 10:
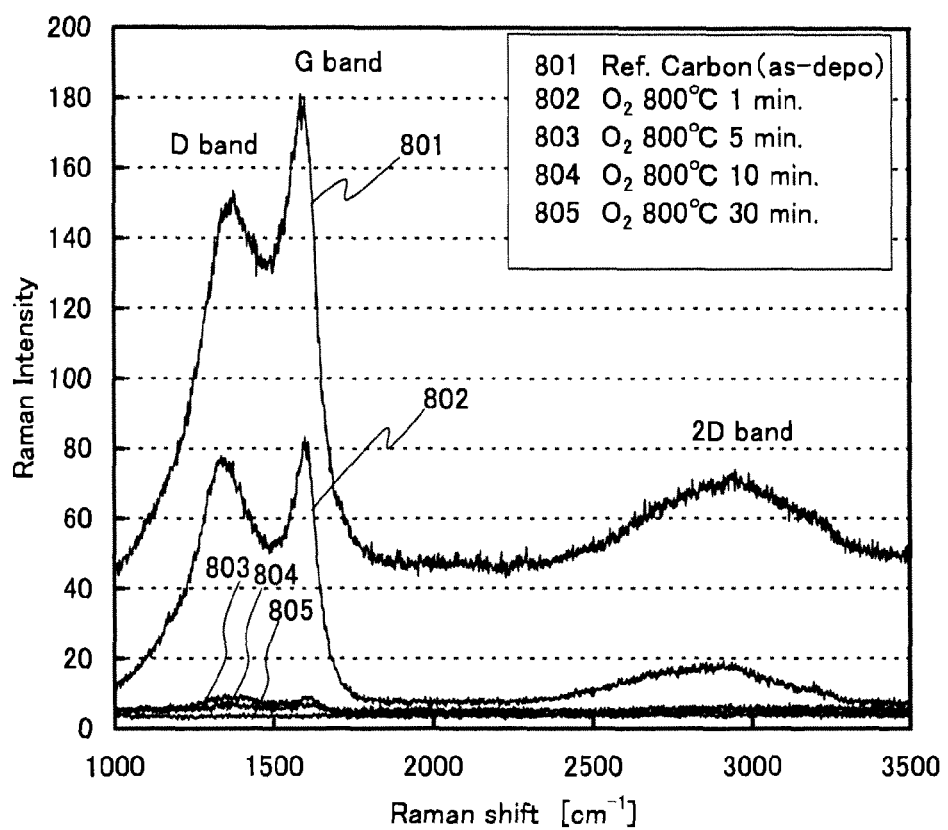
FIG. 10 is a graph showing a relation between cleaning time at 800° C. and peak intensity, which is peculiar to a carbon film.

FIG. 9 and FIG. 10 show measurement results of the Raman spectroscopic analysis of carbon films etched with the use of oxygen at a fixed treatment temperature of 700° C. and 800° C., respectively. The horizontal axis represents the Raman shift (wave number) and the vertical axis represents the Raman intensity. The Raman intensities were measured at different times, whereby remaining films were evaluated.

FIG. 9 shows the measurement results of samples heated at a fixed temperature of 700° C. The measurement was performed under the conditions similar to those in Example 1. In other words, in the film formation apparatus described in Embodiment 1, the pressure of the reaction chamber was 40 Pa and the flow rate of oxygen that is an etching gas was 1 SLM for the cleaning treatment. The samples were each formed by depositing an approximately 40-nm-thick carbon film with an amorphous structure on a titanium foil with an outside diameter of 1 cm.

A solid line 701 shows the Raman spectrum of a reference sample which was not subjected to oxygen etching. Solid lines 702, 703, 704, and 705 show the Raman spectra of samples subjected to oxygen etching for 5 minutes, 10 minutes, 30 minutes, and 60 minutes, respectively. Seeing the results, peaks of the G band and the D band are not shown in the spectrum shown by the solid line 705. This indicates that the 40-nm-thick carbon film can be completely removed by performing oxygen etching at 700° C. for 60 minutes. The rate of the oxygen etching at 700° C. was approximately 0.67 nm/min.

Next, FIG. 10 shows the measurement results of oxygen etching on carbon films at a fixed treatment temperature of 800° C. The samples and measurement conditions are similar to those of the above-described case at 700° C. except for the heating temperature.

A solid line 801 shows the Raman spectrum of a reference sample which was not subjected to oxygen etching. Solid lines 802, 803, 804, and 805 show the Raman spectra of samples subjected to oxygen etching for 1 minute, 5 minutes, 10 minutes, and 30 minutes, respectively. As shown in FIG. 10, peaks of the G band and the D band are almost not shown in the spectrum shown by the solid line 804, which indicates that the 40-nm-thick carbon film can be completely removed by performing oxygen etching at 800° C. for 10 minutes. The rate of the oxygen etching at 800° C. was approximately 4 nm/min.

The above measurement results reveal the etching rate of each of the carbon films with an oxygen gas at 700° C. and 800° C. Accordingly, conditions for cleaning treatment can be selected as appropriate in a heating temperature range from 700° C. to 800° C. That is, to perform the cleaning treatment at high speed, the treatment may be performed at a heating temperature around 800° C.; however, it requires time to decrease the temperature accordingly. For this reason, the heating temperature may be set at around 700° C.; thus, optimal amount of time can be selected for cleaning treatment and decreasing the temperature. Further, as the thickness of a film to be cleaned increases, time for cleaning treatment increases. Therefore, in a mass production process, optimum cleaning treatment can be performed at a temperature higher than or equal to 700° C. and lower than or equal to 800° C. by adjusting the timing of cleaning treatment together with time for cleaning treatment and time for decreasing the temperature.

This application is based on Japanese Patent Application serial no. 2011-254546 filed with Japan Patent Office on Nov. 22, 2011, the entire contents of which are hereby incorporated by reference.

What is claimed is:

1. A method for cleaning a hot-wall type film formation apparatus with a batch processing system, comprising the steps of:
heating an inner wall of a reaction chamber at a temperature higher than or equal to 700° C. and lower than or equal to 800° C.;
introducing an ozone gas into the reaction chamber; and
removing a carbon film deposited on the inner wall of the reaction chamber,
wherein the carbon film is deposited on the inner wall of the reaction chamber by a thermal CVD method, and
wherein a temperature of the inner wall of the reaction chamber is higher than or equal to 700° C. and lower than or equal to 800° C. in the step of removing the carbon film.

2. The method according to claim 1, wherein the carbon film comprises at least one of an alkali metal and an alkaline earth metal.

3. The method according to claim 1, wherein the inner wall of the reaction chamber comprises at least one of a quartz glass, an aluminum alloy, and stainless steel.

4. The method according to claim 1, wherein the step of removing the carbon film is performed under a reduced pressure.

5. A method for cleaning a hot-wall type film formation apparatus with a batch processing system, comprising the steps of:
heating an inner wall of a reaction chamber and introducing an inert gas into the reaction chamber;
stopping supply of the inert gas after reaching a temperature of the reaction chamber 700° C. or more; and
removing a carbon film deposited on the inner wall of the reaction chamber by introducing an ozone gas into the reaction chamber,
wherein a temperature of the inner wall of the reaction chamber is higher than or equal to 700° C. and lower than or equal to 800° C. in the step of removing the carbon film.

6. The method according to claim 5, wherein the carbon film comprises at least one of an alkali metal and an alkaline earth metal.

7. The method according to claim 5, wherein the inner wall of the reaction chamber comprises at least one of a quartz glass, an aluminum alloy, and stainless steel.

8. The method according to claim 5, wherein the step of removing the carbon film is performed under a reduced pressure.

9. A method for manufacturing a semiconductor device comprising steps of:
placing a substrate having a metal catalyst layer with a desired shape formed thereon in a reaction chamber of a hot-wall type film formation apparatus with a batch processing system, wherein the reaction chamber is heated by heating units;
forming a layer comprising carbon on the metal catalyst layer by supplying film formation gases and thermally decomposing a gas containing carbon;
taking out the substrate having the layer thereover from the reaction chamber;
heating an inner wall of the reaction chamber and introducing an inert gas into the reaction chamber;
stopping supply of the inert gas after reaching a temperature of the reaction chamber 700° C. or more; and
removing a carbon film deposited on the inner wall of the reaction chamber by introducing an ozone gas into the reaction chamber,
wherein a temperature of the inner wall of the reaction chamber is higher than or equal to 700° C. and lower than or equal to 800° C. in the step of removing the carbon film.

10. The method according to claim 9, wherein the layer comprises graphene.

11. The method according to claim 9, wherein the carbon film comprises at least one of an alkali metal and an alkaline earth metal.

12. The method according to claim 9, wherein the inner wall of the reaction chamber comprises at least one of a quartz glass, an aluminum alloy, and stainless steel.

13. The method according to claim 9, wherein the step of removing the carbon film is performed under a reduced pressure.

14. A method for manufacturing a semiconductor device comprising steps of:
- placing a substrate having a metal catalyst layer with a desired shape formed thereon in a reaction chamber of a hot-wall type film formation apparatus with a batch processing system, wherein the reaction chamber is heated by heating units;
- forming a layer comprising carbon on the metal catalyst layer by supplying film formation gases and thermally decomposing a gas containing carbon;
- introducing an ozone gas into the reaction chamber after the formation of the layer; and
- removing a carbon film deposited on an inner wall of the reaction chamber,
- wherein a temperature of the inner wall of the reaction chamber is higher than or equal to 700° C. and lower than or equal to 800° C. in the step of removing the carbon film.

15. The method according to claim 14, wherein the layer comprises graphene.

16. The method according to claim 14, wherein the carbon film comprises at least one of an alkali metal and an alkaline earth metal.

17. The method according to claim 14, wherein the inner wall of the reaction chamber comprises at least one of a quartz glass, an aluminum alloy, and stainless steel.

18. The method according to claim 14, wherein the step of removing the carbon film is performed under a reduced pressure.

* * * * *